United States Patent [19]
Wegener

[11] Patent Number: 4,989,127
[45] Date of Patent: Jan. 29, 1991

[54] DRIVER FOR HIGH VOLTAGE HALF-BRIDGE CIRCUITS

[75] Inventor: Armin F. Wegener, Aachen, Fed. Rep. of Germany

[73] Assignee: North American Philips Corporation, New York, N.Y.

[21] Appl. No.: 349,365

[22] Filed: May 9, 1989

[51] Int. Cl.$^5$ .......................................... H02M 3/335
[52] U.S. Cl. ...................................... 363/16; 363/17; 363/56; 363/98
[58] Field of Search ................................. 363/16–21, 363/50, 55, 56, 58, 131, 132

[56] References Cited

U.S. PATENT DOCUMENTS

| | | | |
|---|---|---|---|
| 4,011,494 | 3/1977 | Saka | 363/17 |
| 4,095,128 | 6/1978 | Tanigaki | 363/56 X |
| 4,126,819 | 11/1978 | Stobbe et al. | 363/56 X |
| 4,155,113 | 5/1979 | Simmons | 363/56 |
| 4,158,224 | 6/1979 | Kreyer et al. | 363/56 |
| 4,213,103 | 7/1980 | Birt | 363/56 X |
| 4,371,824 | 1/1983 | Gritter | 363/56 X |
| 4,456,949 | 6/1984 | Incledon | 363/56 X |
| 4,633,381 | 12/1986 | Upadhyay | 363/56 |
| 4,651,269 | 3/1987 | Matsumura | 363/56 X |
| 4,685,040 | 8/1987 | Steigerwald et al. | 363/56 X |
| 4,740,717 | 4/1988 | Fletcher et al. | |
| 4,786,822 | 11/1988 | Steely | 363/17 X |
| 4,796,145 | 1/1989 | Oshikiri | 363/56 X |

FOREIGN PATENT DOCUMENTS 0264614 11/1987 European Pat. Off.

OTHER PUBLICATIONS

An Integrated High-Voltage Bridge Driver Simplifies Drive Circuits in Totem-Pole Inverters, by Brian E. Taylor, Oxford, Surrey, Jun. 1988.
An HVIC MOSFET/IGT Driver for Half-Bridge Topologies, by Dean F. Henderson, GE Solid State, Integrated Power Systems Products, Research Triangle Park, N.C., May 1988.
GESmart Module Simplifies Motor Drive Design, by Donald J. Macintyre, Jr. General Electric Company, Syracuse, N.Y., Nov. 1985.

Primary Examiner—Peter S. Wong
Assistant Examiner—Emanuel T. Voeltz
Attorney, Agent, or Firm—David R. Treacy

[57] ABSTRACT

A driver circuit for a high voltage switching power transistor has a first stage connected to the power transistor control terminal for turning the power transistor on and off, and a second stage connected to the power transistor control terminal acting as a current sink for capacitive current due to the transistor capacitances. The second stage is arranged to turn on when the power transistor control terminal voltage falls below a turn-on value and to be turned off when that voltage rises above a turn-on value. A driver circuit for a high voltage half-bridge switching power circuit, having two such power transistors connected in series, has similar upper and lower driver circuits and a level shifting circuit for providing control pulses to the upper driving circuit.

19 Claims, 1 Drawing Sheet

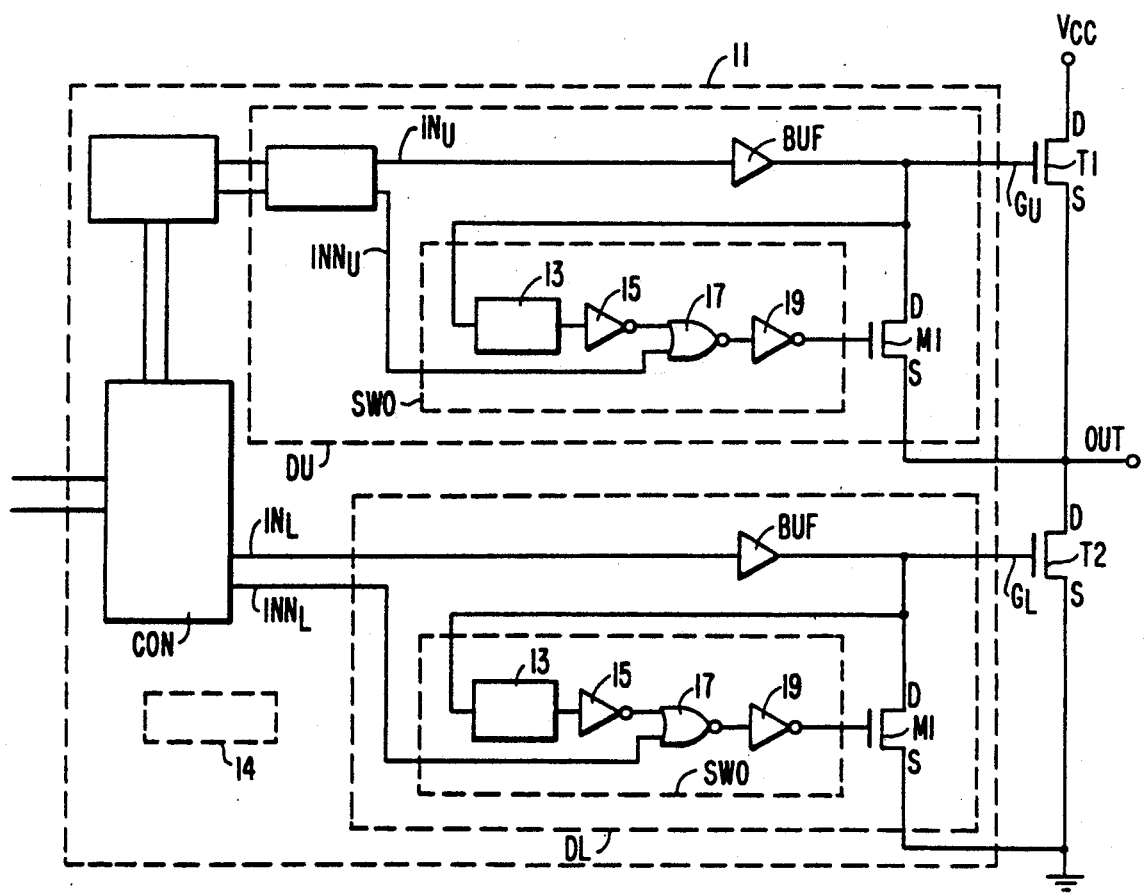

DRIVER FOR HIGH VOLTAGE HALF-BRIDGE CIRCUITS

BACKGROUND OF THE INVENTION

1. Field of the Invention

In many applications a load is to be supplied with a current of variable frequency or amplitude. To do this with high efficiency, and to minimize the size and cost of the components needed, the output power stages are preferably operated in a switched mode. One commonly used arrangement uses two power transistors, such as power MOSFET's or IGBT's, connected in series across the DC supply, with the load connected to the junction between the output transistors—the so-called half-bridge circuit.

Applications of such circuits include electronic ballasts for high intensity gas discharge (HID) lamps, switched mode power supplies having high switching frequencies, and motor drives for electronically commutated DC and AC motors. A commonly applied control method for such integrated circuits (ICs) is pulse width modulation (PWM) as the control signals to achieve current or power regulation, which in turn determines the arc current, motor torque, or the like.

A major problem encountered in designing such half-bridge circuits is the drive for the upper one of the two power devices. This upper device is a high side switch referenced to the output of the half-bridge. This output is a voltage which is varied between approximately zero (0) volts and the DC supply line (rail) voltage; this supply or "rail" can be as high as 500 V for 230 volt power lines.

To minimize the size of components, and to keep any noise produced by an inverter or switched mode amplifier from becoming audible, the half-bridge output circuit is frequently operated at a frequency above 20 kHz so that no audible noise is generated by the circuit.

A drive circuit for a switching half-bridge output should satisfy many requirements, including the following:

Breakdown voltage of at least 500 V
Sufficient gate drive current for fast switching of the power transistors, thus keeping switching losses low
Gate drive current limited to minimize electromagnetic interference
Reliable prevention of simultaneous conduction by the two power devices, to prevent short-circuiting of the DC supply (shoot-through protection)
Direct addressability by one output signal of a microcontroller for each half-bridge leg; that is, input signal levels of 5 to 15 V, without any external delay circuit
Toleration of output voltage slew rates up to 5 to 10 V/ns during switching, particularly with inductive loads
Switching frequency response to 500 kHz
Low power consumption.

2. Description of the Prior Art

Known discrete drive circuits fall into two categories: fast, but relatively inefficient, thus dissipating undesirably large amounts of power; or efficient but slow.

European Patent Application 0 264 614 teaches that resistors should be inserted between each of the output transistors and the common node to which the load is connected, or alternatively the leading edge of the turn-on input signal should be delayed sufficiently to ensure that the other transistor has turned fully off.

A relatively complex high voltage integrated circuit providing shoot-through protection is described in "An HVIC MOSFET/IGT Drive for Half-Bridge Topologies" HFPC May 1988 Proceedings, pp. 237–245.

U.S. Pat. No. 4,740,717 teaches use of a hysteresis circuit in a driver for a half-bridge power stage, to prevent undesired changes in state of the output device due to noise produced in the integrated circuit.

Other techniques for improving shoot-through protection include markedly different structures. Pulse transformers have been used successfully, but are expensive. Optical couplers provide good isolation to the upper device of a full wave output stage, but are often slow and not very reliable; and they consume considerable power for the internal light emitting diodes.

SUMMARY OF THE INVENTION

An object of the invention is to provide a half-bridge high voltage switching device having minimal levels of electromagnetic interference.

Another object of the invention is to provide an interface driver circuit for a half-bridge output, which will be self-adapting to the gate current and capacitances of the output power devices.

A further object of the invention is to protect against shoot-through caused by the Miller capacitance of one turned-off output device when the other output device is turned on.

Yet another object is to enable control of the gate drive current of a transistor independent of the gate drive impedance when the transistor is off.

According to the invention, these objects are achieved by providing two stages in the driver circuit, connected to the transistor control terminal, one for at least the turn-off signal, and the other stage functioning as a current sink for currents to the control terminal while the transistor is turned off. The driver circuit includes circuit portions for sensing the transistor control (gate) voltage, and for turning the second stage on when the control voltage has fallen below the turn-on/turn-off voltage.

In a preferred embodiment of the invention, the circuit portion for sensing the transistor control voltage comprises a Schmitt trigger, whose triggering level in the falling (transistor turn-off) direction is below the transistor turn-on/turn-off voltage, and whose triggering level for a rising signal is higher than that voltage.

In a further preferred embodiment of the invention, the current-sink stage comprises a transistor having one current-carrying electrode connected to the control terminal, and is controlled by a gate which receives one signal from the Schmitt trigger and another signal which is based on the input signal to the driver circuit.

In yet another embodiment of the invention, a low voltage driver circuit for driving a high voltage half-bridge circuit has a lower driving circuit for driving the lower transistor of the half-bridge, and an upper driving circuit for the upper transistor, the upper and lower driving circuits having similar first and second stages for turning the respective transistor off, and sinking capacitance currents from the transistor control terminal.

In still a further embodiment of the invention, a high-voltage half-bridge switching power circuit has upper and lower field-effect transistors in the output; a lower driving circuit having one stage for driving the output transistor gate and a second stage for sinking Miller capacitance currents from that gate; a level shift circuit providing turn-on and turn-off pulses to an upper driving circuit; and the upper driving circuit is schematically like the lower circuit except for addition of a latch providing the control signals for the first and second stages.

BRIEF DESCRIPTION OF THE DRAWING

The sole figure is a block diagram of a half-bridge circuit and driver in accordance with the invention.

DESCRIPTION OF THE PREFERRED EMBODIMENT

The high voltage half-bridge circuit shown in the figure is conventional, and has an upper field effect transistor T1 connected in series with an identical lower field effect transistor T2, between a high voltage source or rail $V_{cc}$ and ground. The load is connected to a terminal OUT which is the node common to the two transistors. The control electrodes or gates of the transistors T1 and T2 are connected to respective terminals $G_U$ and $G_L$ of a novel high voltage interface circuit 11.

The interface circuit 11 is made as one integrated circuit, and contains four principal sub-circuits upper and lower driving circuits DU and DL, which are similar schematically; a level shift circuit LS for control pulses to the upper driving circuit DU; and a control circuit CON which receives input signals from a microcontroller or other application-specific unit defining the timing and duration of turn-on of each of the transistors T1 and T2, performs protection functions and provides signals to the level shift and lower driving circuits.

According to the invention, each driving circuit has an amplifier or buffer stage BUF whose output is connected to the respective terminal $G_U$ or $G_L$ to provide the gate control voltage and the gate turn-on and turn-off current; a transistor M1 having its drain electrode connected to the gate of the power transistor T1 or T2, which functions as a current sink for capacitances to the gate of the power transistor (Miller capacitance); and a sensing and delay circuit SWO which turns the transistor M1 on when the gate voltage on the respective terminal $G_U$ and $G_L$ falls below a selected minimum value, and turns the transistor M1 off when the same gate voltage rises above a predetermined higher voltage.

For simplicity, the structure and operation of the control circuits SWO will be described with reference to the lower circuit, which includes a Schmitt trigger 13 to which the gate voltage at $G_L$ is connected. When used with a power transistor T2 having a gate turn-on/turn-off voltage at least 2.0 volts, and a supply voltage of 12 volts, provided by a supply 14 in the interface circuit 11, the trigger 13 is designed to switch at about 1.8 volts for a negative-going signal, and about 6 volts for a positive-going signal. The output of the trigger 13 is inverted in an inverter 15, and then provided as one input to a NAND gate 17. The output of the gate 17 is amplified in an inverting amplifier 19 and is applied as the control or gate voltage to the transistor M1.

The driving circuit DL receives two input signals from the logic circuit CON: input $IN_L$ which is the turn-on/turn/off signal for the buffer BUF, and an inverted signal $INN_L$ which is the second input to the gate 17. The sensing and delay circuit SWO thus operates as follows:

When a turn-on signal $IN_L$ is received, the output of BUF goes high to turn T2 on. At the same time, $INN_L$ goes low, so that the output of NAND gate 17 goes high, the output of inverter 19 goes low, and sink transistor M1 is turned off. As the gate voltage $G_L$ passes the rising trigger level of Schmitt trigger 13, the output of the trigger goes high, and the output of inverter 15 goes low. NAND gate 17 output remains high.

When T2 is to be turned off, $IN_L$ and $INN_L$ go respectively low and high. Gate voltage $G_L$ drops at a slew rate determined by the current capacity of the amplifier BUF and the capacitances (mainly Miller effect) of the gate of T2. The output of gate 17 does not immediately change because trigger 13 does not change until the voltage $G_L$ falls below the T2 turn-off value, to the triggering value for the Schmitt trigger. Then the output of trigger 13 goes low, and the output of inverter 15 goes high. The other input of gate 17 having already gone high, the output of NAND 17 goes low, and via inverter 19 sink transistor M1 is turned on. Thus the low impedance of the sink is not applied to the gate of T2 until after T2 has been turned off. This keeps values of dV/dt from rising to such high levels that serious EMI fields are produced.

Functionally similar portions of the upper driving circuit DU are identical schematically, and have exactly the same turn-on and turn-off functioning. Signals $IN_U$ and $INN_U$ are obtained from a latch which is set and reset by current pulses from two current mirrors in the level shift circuit LS. This use of short current pulses in combination with the latch can reduce the static power consumption close to zero. Also, the latch can be arranged to insure that the latch is always in the reset state during power-up, thus ensuring that the transistor T1 is off.

If one output transistor is turned on and off while the other remains off, each turn-on of the one induces a large Miller capacitance current in the gate circuit of the other. The circuit according to the invention prevents unwanted turn-on of the other (shoot through) by this current because of the current sink stage transistor M1.

Desirably the control logic CON provides a short delay of about 500 ns between turn-off of one power transistor and turn-on of the other, further to prevent shoot-through. Further, this circuit should incorporate the usual fault protections; and, as is known, switching off both power transistors in the event of a fault signal. After a short delay, the lower transistor T2 is switched on to charge the bootstrap capacitor in power supply 14, while the upper transistor remains off.

An integrated HVIC such as shown in the drawing may be made by principles described in "A Power IC with CMOS Analog Control" by Wacyk, Amato and Rumennik, IEEE International Solid-State Circuits Con., 1986, pp. 16–17. When the high voltage devices are LDMOS transistors designed by the RESURF principle, used with $V_{CC}=500$ VDC, 3 $\mu$m low voltage CMOS transistors appear suitable. Process architecture may be based on a dual poly, dual well CMOS process with self-aligned n and p wells. The CMOS circuitry in the floating drive DU is isolated from the p-type grounded substrate by an n+ buried layer and n-well diffusions. This design of the high voltage isolation for the floating CMOS is equivalent to that of the LDMOS transistors. Such a process can provide breakdown voltage for the floating well and LDMOS transistors exceeding 600 V, which provides ample margin for a 500 VDC supply rail.

In a test circuit according to the invention, the transistor M1 was switched on when the power transistor gate voltage was below its minimum threshold, so that the power device remained completely turned off. The transistor M1 remained on while the voltage at $G_L$ was below 0.5 volts. Via the gate 17, the transistor M1 was turned off immediately after the signal IN went high. Thus this adaptive switching adapted automatically to the negative slope of the power device gate voltage, which is influenced by the size of the device (its gate and Miller capacitances), the value of the high voltage supply, and the power circuit configuration in general.

Testing of an experimental chip showed good performance with a load of 800 ohms resistive in series with 1 mh inductance, up to 500 VDC. Also, operating with a supply voltage of 300 V at a frequency of 300 kHz and a large inductive load produced values of dV/dt exceeding 11 V/ns without malfunction of the circuit or chip.

The transistor M1 and circuit SWO provide a dynamic change of the T2 gate discharge impedance which is dependent on actual gate voltage. This circuitry is thus generic in its application, because it adapts to a wide spread in power transistor parameters, the DC supply voltage, and the power stage configuration and operation in general.

When using pulse width modulation, the performance of the drives DL and DU is critical. Drive currents should be relatively high to reduce switching times, and thus reduce switching losses. At the same time the switching speed has an upper limit imposed by the recovery time of the high voltage devices carrying the load currents and flywheel currents. It is desirable that the drive circuits be able to withstand values of dV/dt of 10 V/ns, while the gate current delivered by the buffer stage must be limited according to the value of the gate-drain (Miller) capacitance.

To allow the use of a wide variety of power devices, the peak current deliverable by the HVIC 11 has been chosen to be 100 ma. The optimum drive current for specified power transistors is then obtained by external resistors (not shown). Alternatively, the rate of rise of the reverse voltage of the body diode may be limited by a turn-on snubber circuit. Such a circuit would also reduce the reverse recovery current amplitude at turn-on.

Similarly, very rapid discharge of the gate capacitance by too large a gate current would cause undesirable electromagnetic interference (EMI) problems due to coupling of switching edges into the ground connection. The sink current may thus be desirably be limited to 300 ma.

It will be clear to those of ordinary skill in the art that many modifications and uses of the inventive circuits are possible. For example, the half-bridge circuit and drivers can be used for each of the phases of a polyphase motor, where each half-bridge is switched in phase sequence relative to the others. Both switching frequency and pulse width can be controlled to vary power levels applied to the load, and the response of the load to the amount of power delivered.

Where the balanced drive of a half-bridge output is not required, but one end of the load must be at ground potential, a single driver circuit according to the invention will provide desirable adaptation to the characteristics of the power switching device, while providing high frequency response without false turn-on due to Miller capacitance affecting the gate voltage.

The invention has been described with respect to power field-effect transistors, but it will be clear that the sensing and delay effect of the circuit SWO may be applied to any driving circuit where compensation for currents like the Miller effect is desirable.

I claim:

1. A driver circuit for driving a device having a control terminal through which a capacitive current flows during turn-off of the device, comprising:

a first stage having an input terminal and an output terminal, the input terminal being arranged for receiving a control signal for turning such a device, connected to the driver circuit, on and off, means for connecting said output terminal to the control terminal of said device, to apply thereto a control voltage for turning the device on and off, current sink means for said capacitive current, comprising a second stage having a current sink terminal connected to said control terminal, means for sensing said control voltage, and means, controlled by said means for sensing, for turning said second stage on when said control voltage falls below a first minimum value, and turning said second stage off when said control voltage rises above a second value greater than said first minimum value.

2. A circuit as claimed in claim 1, characterized in that said device has a turn-on/turn-off gate voltage, and said first minimum value is less than said turn-on/turn-off voltage.

3. A circuit as claimed in claim 1, characterized in that said means for sensing comprises a Schmitt trigger.

4. A circuit as claimed in claim 1, characterized in that said second stage comprises a transistor having a control electrode and two other electrodes, one of said two other electrodes being said current sink terminal, and said means for turning comprises a gate having two gate inputs and a gate output, one of said gate inputs receiving a signal from said means for sensing; and means for connecting said gate output to said control electrode.

5. A circuit as claimed in claim 4, comprising means for providing a signal, based on said control signal, to the other of said gate inputs.

6. A circuit as claimed in claim 5, characterized in that said device has a turn-on/turn-off gate voltage, and said first minimum value is less than turn-on/turn-off voltage.

7. A circuit as claimed in claim 6, characterized in that said means for sensing comprises a Schmitt trigger.

8. A circuit as claimed in claim 4, wherein the control signal received by said first stage is a level shifted signal, comprising a level shifting circuit receiving a first control signal, said level shifting circuit providing a level shifted control signal to said first stage, and a signal based on said first control signal to the other of said gate inputs.

9. A low voltage interface circuit for driving a high voltage half-bridge circuit comprising upper and lower power transistors each having a control terminal through which a capacitive current flows during turn-off of the respective power transistor, said interface circuit comprising an upper driving circuit for driving the control terminal of such an upper power transistor, and a lower driving circuit for driving the control terminal of the lower power transistor, and at least one input terminal for receiving a control signal for turning at least one said power transistor on and off, characterized in that the upper and lower driving circuits each comprise:

a first stage having a respective input terminal and a respective output terminal, each input terminal being arranged for receiving a respective control signal for turning the corresponding power transistor on and off, means for connecting each respective output terminal to the control terminal of the corresponding power transistor, to apply thereto a control voltage for turning said corresponding power transistor on and off, current sink means for the respective capacitive current, comprising a respective second stage having a current sink terminal connected to the corresponding control terminal, means for sensing the respective control voltage, and means, controlled by the respective means for sensing, for turning the respective second stage on when the corresponding control voltage falls below a first minimum value, and turning said second stage off when the corresponding control voltage rises above a second value greater than said first minimum value.

10. A circuit as claimed in claim 9, characterized in that each said power transistor has a turn-on voltage, and said first minimum value is less than said turn-on voltage.

11. A circuit as claimed in claim 9, characterized in that each said means for sensing comprises a Schmitt trigger.

12. A circuit as claimed in claim 9, characterized in that each said second stage comprises a transistor having a control electrode and two other electrodes, one of said two other electrodes being said current sink terminal, and said means for turning comprises a gate having two gate inputs and a gate output, one of said gate inputs receiving a signal from the respective means for sensing; and means for connecting said gate input to the corresponding control electrode.

13. A circuit as claimed in claim 12, comprising means for providing a signal, based on the respective control signal, to the respective other of said gate inputs.

14. A circuit as claimed in claim 13, characterized in that each said power transistor has a turn-on voltage, and said first minimum value is less than said turn-on voltage.

15. A circuit as claimed in claim 14, characterized in that each said means for sensing comprises a Schmitt trigger.

16. A circuit as claimed in claim 15, comprising a level shifting circuit having output pulses, wherein said upper driving circuit comprises a latch which is set and reset by said pulses, said first stage of the upper driving circuit being controlled by said latch.

17. A high voltage power circuit comprising:

a high voltage half-bridge circuit comprising upper and lower power transistors each having a control terminal through which a capacitive current flows during turn-off of the respective power transistor, a driver circuit comprising an upper driving circuit for driving the control terminal of said upper power transistor, and a lower driving circuit for driving the control terminal of the lower power transistor, and at least one input terminal for receiving a control signal for turning at least one said power transistor on and off, characterized in that the upper and lower driving circuits each comprise:

a first stage having a respective input terminal and a respective output terminal, each input terminal being arranged for receiving a respective control signal for turning the corresponding power transistor on and off, means for connecting each respective output terminal to the control terminal of the corresponding power transistor, to apply thereto a control voltage for turning said corresponding power transistor on and off, current sink means for the respective capacitive current, comprising a respective second stage having a current sink terminal connected to the corresponding control terminal, means for sensing the respective control voltage, and means, controlled by the respective means for sensing, for turning the respective second stage on when the corresponding control voltage falls below a first minimum value, and turning said second stage off when the corresponding control voltage rises above a second value greater than said first minimum value.

18. A circuit as claimed in claim 17, characterized in that each said second stage comprises a transistor having a control electrode and two other electrodes, one of said two other electrodes being said current sink terminal, and said means for turning comprises a gate having two gate inputs and a gate output, one of said gate inputs receiving a signal from the respective means for sensing; and means for connecting said gate output to the corresponding control terminal.

19. A circuit as claimed in claim 18, comprising means for providing a signal, based on the respective control signal, to the respective other of said gate inputs.

* * * * *